United States Patent [19]
Chun et al.

[11] Patent Number: 5,786,779
[45] Date of Patent: Jul. 28, 1998

[54] DIGITAL-TO-ANALOG CONVERTER WHICH USES A SIGMA-DELTA MODULATION

[75] Inventors: Phil-Seong Chun, Kwacheon; Kwang-Yong Lee, Yongin-gun, both of Rep. of Korea

[73] Assignee: Samsung Electronics Co., Ltd., Kyungki-Do, Rep. of Korea

[21] Appl. No.: 694,114

[22] Filed: Aug. 8, 1996

[30] Foreign Application Priority Data

Aug. 8, 1995 [KR] Rep. of Korea .................. 24433/1995

[51] Int. Cl.$^6$ .................................................. H03M 3/02
[52] U.S. Cl. .................................................. 341/61; 341/143
[58] Field of Search .................................. 341/61, 143, 144

[56] References Cited

U.S. PATENT DOCUMENTS

| | | | |
|---|---|---|---|
| 5,489,903 | 2/1996 | Wilson et al. | 341/144 |
| 5,512,895 | 4/1996 | Madden et al. | 341/61 |
| 5,654,711 | 8/1997 | Fujimori | 341/143 |

*Primary Examiner*—Marc S. Hoff
*Attorney, Agent, or Firm*—Sughrue, Mion, Zinn, Macpeak & Seas, PLLC

[57] ABSTRACT

A digital-to-analog (D/A) converting apparatus for converting digital data to an analog signal is provided. Specifically, the apparatus contains a sampling rate converting circuit, an interpolator, a digital sigma-delta demodulation circuit, and an analog D/A converter. The converting circuit inputs and converts the digital data into sampled digital data. Then the interpolator interpolates the sampled digital data to produce interpolated data. Also, the interpolator has an infinite impulse response (IIR) filter which performs an IIR filtering operation based on the sampled digital data to produce the interpolated data. The demodulation circuit inputs the interpolated data, performs a sigma-delta demodulation operation on the interpolated data, and outputs corresponding demodulated data. Then, the analog D/A converter converts the demodulated data to the analog signal. By using the interpolator and the demodulation circuit, the structure of the converting apparatus is relatively simple. Accordingly, the apparatus can be easily integrated to produce a compact device.

40 Claims, 2 Drawing Sheets

DIGITAL-TO-ANALOG CONVERTER WHICH USES A SIGMA-DELTA MODULATION

RELATED APPLICATION

The present application is based on Korean Application No. 244433/1995 which is incorporated herein by reference for all purposes.

1. Field of the Invention

The present invention relates to a digital-to-analog (D/A) converter which converts digital data into analog data. More particularly, the present invention relates to a D/A converter which converts digital data into analog data by using a sigma-delta ($\Sigma\Delta$) modulation method.

2. Background of the Invention

In order to convert analog data to digital data, an analog-to-digital (A/D) converter may typically be used. For example, the A/D converter may convert the data by using an $\Sigma\Delta$ modulation method and may comprise an analog $\Sigma\Delta$ modulator, a decimator, a low pass filter (LPF), and an accumulating and dumping circuit. Furthermore, the analog $\Sigma\Delta$ modulator may contain first, second, third, and fourth $\Sigma\Delta$ modulators depending on the particular application of the A/D converter.

The decimator, the LPF, and the accumulating and dumping circuit are generally implemented with a comb filter in order to remove high frequency noise from the analog signal before it is converted into digital data. Moreover, the number of comb filters which are typically used is based on the dynamic range over which the analog signal is to be converted. Also, an increased number of comb filters may be used to increase the bit resolution of the digital data by increasing signal-to-noise ratio of the analog signal. Furthermore, the decimator may also reduce the noise in a certain frequency band whenever an analog signal passes through a multistage comb filter by decreasing the operational frequency in order to reduce the amount of high frequency noise contained in the signal.

Sometime after the analog signal has been converted into digital data, the digital data can be input to a digital-to-analog (D/A) converter to convert the digital data back into an analog signal. FIG. 1 shows an example of a D/A converter for converting digital data into an analog signal. Specifically, the D/A converter comprises a shift register 100, an LPF 102, a linear interpolator 104, and an analog $\Sigma\Delta$ demodulator 106.

In order to convert the digital data, the data is input to the linear interpolator 104 via the shift register 100 and the LPF 102. Then, the interpolator 104 increases frequency of the data while lowering the bit resolution of the data in order to convert the data from baseband data into pass band data. Specifically, the interpolator 104 includes a dumping and accumulating circuit which operates in a reverse order in which the dumping and accumulating circuit operates in the A/D converter.

However, since the D/A converter described above uses a dumping and accumulating circuit, the D/A converter must use a relatively large number of shift registers, and thus, the structure of the D/A converter is relatively complicated. Moreover, integrating the complicated structure of the analog $\Sigma\Delta$ demodulator is relatively difficult.

SUMMARY OF THE INVENTION

In order to solve the above problems, one object of the present invention is to provide a digital-to-analog (D/A) converting apparatus which uses a $\Sigma\Delta$ modulation method and has a simple structure.

Another object of the present invention is to provide a D/A converting apparatus which uses a $\Sigma\Delta$ modulation method and is capable of being easily integrated.

In order to achieve the objects above, a D/A converting apparatus which converts digital data into an analog signal is provided. Specifically, the converting apparatus comprises: a sampling rate converting circuit, wherein said sampling rate converting circuit inputs said digital data and converts said digital data into sampled digital data; an interpolator which interpolates said sampled digital data to produce interpolated data, wherein said interpolator has an infinite impulse response (IIR) filter which performs an IIR filtering operation based on said sampled digital data to produce said interpolated data; a digital sigma-delta demodulation circuit which inputs said interpolated data, performs a sigma-delta demodulation operation on said interpolated data, and outputs corresponding demodulated data; and an analog digital-to-analog converter for converting said demodulated data to said analog signal.

Furthermore, the interpolator comprises: a first shifter for shifting said sampled digital data to produce first shifted data having a bit resolution which is greater than a bit resolution of said sampled digital data. Moreover, said IIR filter inputs said first shifted data and performs said IIR filtering operation based on said first shifted data.

Also, the IIR filter comprises: a first data selector, wherein said first data selector inputs said first shifted data from said first shifter, second shifted data, and a first clock signal and wherein said first data selector selectively outputs either said first shifted data or said second shifted data as first selected data in accordance with said first clock signal; a first adder, wherein said first adder inputs said first selected data and first latched data and adds said first selected is data and said first latched data to produce first summed data; a first latch circuit, wherein said first latch circuit inputs said first summed data and delays said first summed data by one period of a second clock signal to produce said first latched data; a second shifter, wherein said second shifter inputs said first latched data and shifts said first latched data to produce third shifted data; a second data selector, wherein said second data selector inputs said second shifted data and said third shifted data and wherein said second data selector selectively outputs either said second shifted data or said third shifted data as second selected data in accordance with said first clock signal; a second adder, wherein said second adder inputs said second selected data and said interpolated data and adds said second selected data and said interpolated data to produce second summed data; a second latch circuit, wherein said second latch circuit inputs said second summed data and delays said second summed data by one period of said second clock signal to produce said interpolated data; an inversion circuit, wherein said inversion circuit inputs and inverts said interpolated data to produce inverted data; and a third shifter, wherein said third shifter inputs and shifts said inverted data to produce said second shifted data.

In addition, the digital sigma-delta demodulation circuit comprises: a fourth shifter, wherein said fourth shifter inputs and shifts said interpolated data to produce fourth shifted data; first addition means for inputting said fourth shifted data, third selected data, and second latched data and for adding said fourth shifted data, said third selected data, and said second latched data to produce third summed data; a third latch circuit, wherein said third latch circuit inputs said third summed data and delays said third summed data by one period of said first clock signal to produce said second latched data; a fifth shifter, wherein said fifth shifter inputs said second latched data and shifts said second latched data to produce fifth shifted data; second addition means for inputting said fifth shifted data, said third selected data, and third latched data and for adding said fifth shifted data, said third selected data, and said third latched data to produce fourth summed data; a fourth latch circuit, wherein said fourth latch circuit inputs said fourth summed data and delays said fourth summed data by one period of said first clock signal to produce said third latched data; and a third data selector, wherein said third data selector inputs a first preset range value, a second preset range value, and at least one bit of said third latched data, wherein said third data selector selectively outputs either said first preset range value or said second preset range value in accordance with said at least one bit of said third latched data, and wherein said at least one bit of said third latched data corresponds to said demodulated data.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

The following description of the preferred embodiments discloses specific circuit configurations, components, logical states, bit numbers, and frequencies. However, the preferred embodiments are merely examples of the present invention, and thus, the specific components and values described below are only used to more easily describe such embodiments and to provide an overall understanding of the present invention. Accordingly, one skilled in the art will readily recognize that the present invention is not limited to the specific components and values described below. Furthermore, the descriptions of various features and structures of the present invention which would be known to one skilled in the art are omitted for the sake of clarity and brevity.

Figure 1:
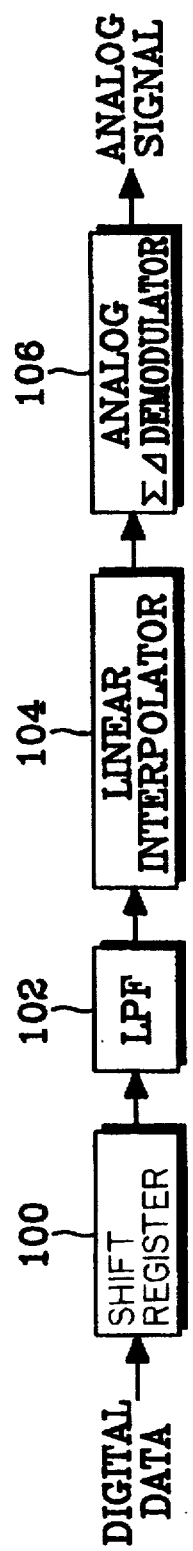
FIG. 1 is a diagram of a conventional digital-to-analog (D/A) converter which uses a sigma-delta ($\Sigma\Delta$) modulation method.
Figure 2:
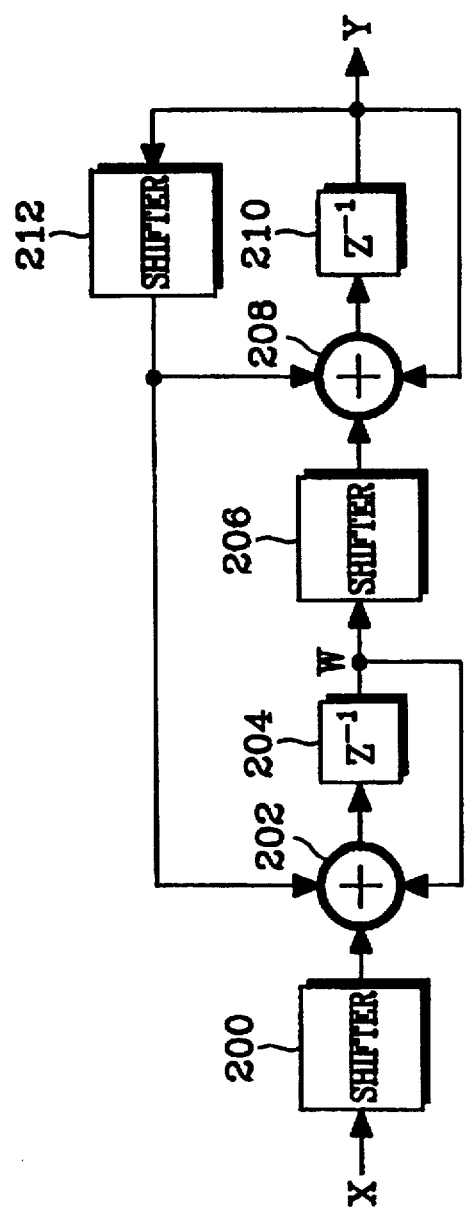
FIG. 2 is a diagram of an embodiment of an infinite impulse response filter according to the present invention.

The digital-to-analog (D/A) converter of the present invention comprises a decimator and an interpolator which contains an infinite impulse response (IIR) filter. An example of an embodiment of the IIR filter is shown in FIG. 2. Specifically, the IIR filter comprises shifters 200, 206, and 212, adders 202 and 208, and delays 204 and 210.

The shifter 200 receives input digital data X, shifts such data X by seven bits, and outputs first shifted data. Then, the adder 202 inputs the first shifted data from the shifter 200, second shifted data from the shifter 212, and first delayed data W from the delay 204. Then, the adder 202 adds the first shifted data, the second shifted data, the delayed data W and outputs the sum of such data as first summed data.

Subsequently, the delay 204 inputs the first summed data and delays such data for one period to produce the first delayed data W. Then, the shifter 206 inputs the delayed data W and shifts the data W by six bits to produce third shifted data. The adder 208 inputs the third shifted data from the shifter 206, the second shifted data from the shifter 212, and the final digital data Y from the delay 210, and outputs the sum of such data as second summed data.

The delay 210 inputs the second summed data from the adder 208 and delays such data by one period to produce the final digital data Y. Furthermore, the shifter 212 inputs the digital data Y and shifts such data by seven bits to produce the second shifted data. Such shifted data is then output to the adders 202 and 208.

In order to more fully understand the operation of the IIR filter shown in FIG. 2, the following assumptions will be made about the characteristics of the filter. First, the decimation ratio of the shifter 200 equals a1, the decimation ratio of the shifter 206 equals a2, and the decimation ratio of the shifter 212 equals b1. In addition, the values a1, a2, and b1 equal 1/128, 1/64, and 1/128, respectively.

In light of such assumptions, the first delayed data W may be expressed according to equation 1, and the final digital data is Y may be expressed according to equation 2.

$$W = (b1Y + a1X + W)Z^{-1} \quad (1)$$

$$Y = (a2W + b1Y + Y)Z^{-1} \quad (2)$$

In addition, by manipulating equations 1 and 2, the final output Y may be expressed as equation 3.

$$Y = \frac{0.000122}{Z^2 - 2.0078125Z + 1.0076905} \quad (3)$$

As illustrated by equation 3, when the IIR filter is used to perform the interpolation operation, the hardware structure necessary to perform such operation is simpler than the conventional technology.

Figure 3:
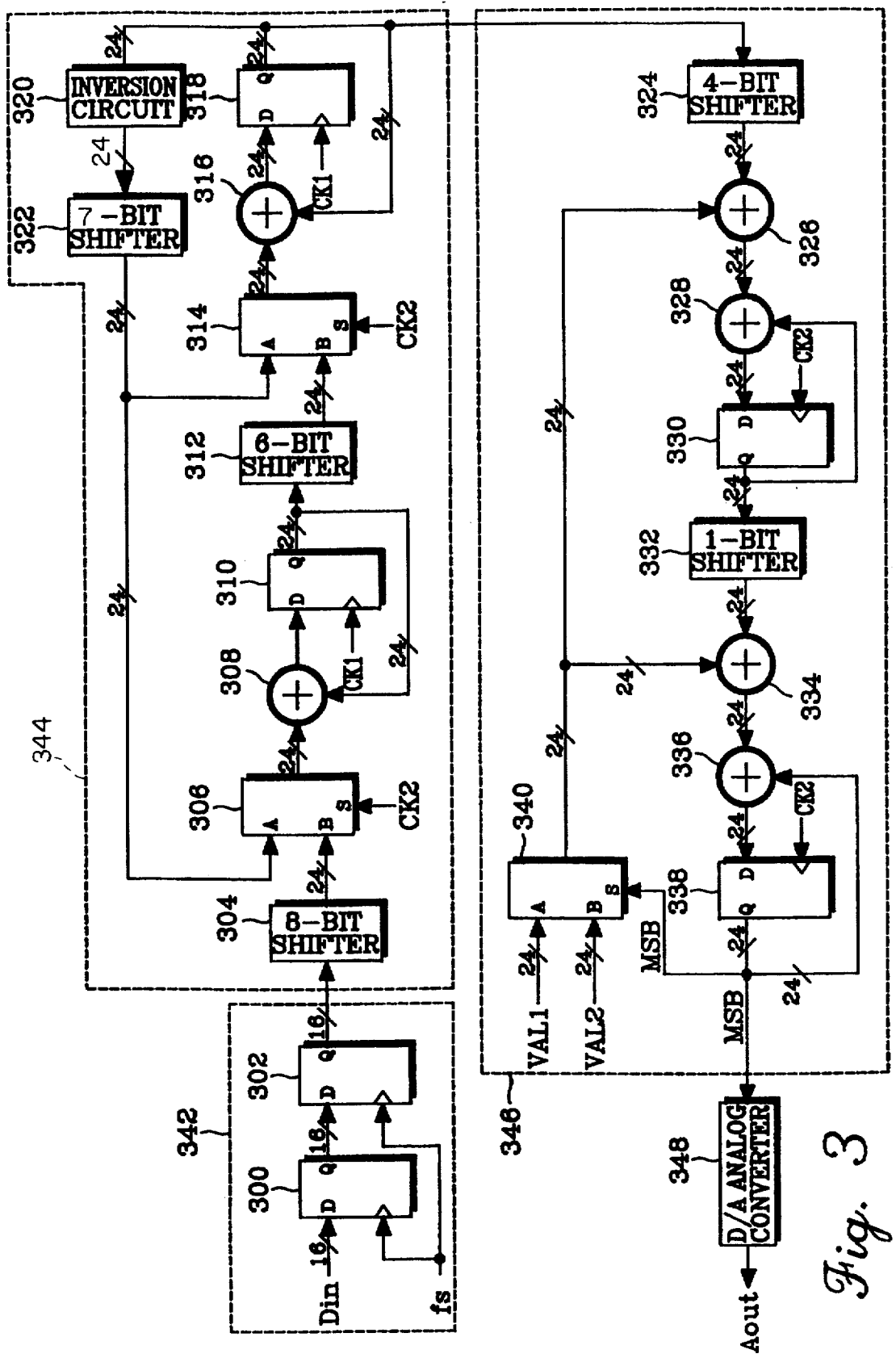
FIG. 3 is a diagram of an embodiment of a D/A converter which uses an $\Sigma\Delta$ modulation method.

FIG. 3 illustrates one embodiment of a D/A converter which uses an IIR filter similar to the filter illustrated in FIG. 2 and which uses an $\Sigma\Delta$ modulation method. Specifically, the D/A converter comprises a sampling rate converting circuit 342, an interpolator 344, a digital $\Sigma\Delta$ demodulation circuit 346, and a D/A analog converter 348.

The sampling rate converting circuit 342 comprises latch circuits 300 and 302. The latch circuit 300 inputs the digital data Din and outputs such data Din in accordance with a sampling clock signal fs. Similarly, the latch circuit 302 inputs the digital data Din from the latch circuit 300 and outputs such data Din in synchronicity with the sampling clock signal fs as sampled digital data. Furthermore, the frequency of the clock signal fs may be twice the frequency of a transmission clock signal fd which synchronizes the transmission of the digital data Din. Accordingly, the sampling rate converting circuit 342 inputs 16 bits of digital data Din and samples such data Din based on the sampling clock signal fs to produce the sampled digital data.

The interpolator 344 incorporates an IIR filter which is similar to the IIR filter shown in FIG. 2 and which interpolates the sampled digital data output from the converting circuit 342. Specifically, the interpolator 344 comprises an eight bit shifter 304, data selectors 306 and 314, adders 308 and 316, latch circuits 310 and 318, a six bit shifter 312, an inversion circuit 320, and a seven bit shifter 322.

The eight bit shifter 304 inputs the 16-bit sampled digital data and shifts such data by eight bits to produce 24-bit first shifted data. In other words, the sampled digital data is shifted in order to increase the resolution of the digital data to 24 bits. Then, the data selector 306 inputs the first shifted data from the shifter 304, second shifted data from the seven bit shifter 322, and a first clock signal CK2. Afterwards, the selector 306 alternatively and selectively outputs the first and second shifted data in accordance with the signal CK2 to produce first selected data. Moreover, in order to appropriately synchronize the output of the data selector 306, the clock signal CK2 may have a frequency which is 128 times larger than the frequency of the sampling clock signal fs.

The adder 308 inputs the first selected data from the selector 306 and first latched data from the latch circuit 310 and adds the latched data and the selected data to produce first summed data. Subsequently, the latch circuit 310 latches the first summed data as the first latched data based on a second clock signal CK1 in order to delay the output of the first summed data for one period of the clock signal CK1. Also, in order to properly delay the summed data, the clock signal CK1 may have a frequency which is 256 times larger than the frequency of the sampling clock signal fs.

The six bit shifter 312 inputs the first latched data and shifts such data by six bits to produce third shifted data. Afterwards, the data selector 314 inputs the third shifted data, the second shifted data from the seven bit shifter 322, and the clock signal CK2. Then, the selector 314 alternatively and selectively outputs the second and third shifted data to produce second selected data in accordance with the signal CK2.

The adder 316 inputs the second selected data from the selector 314 and interpolated data from the latch circuit 318 and adds the interpolated data and the selected data to produce second summed data. Subsequently, the latch circuit 318 latches the second summed data as the interpolated data based on the second clock signal CK1 in order to delay the output of the second summed data for one period of the second clock signal CK1.

The inversion circuit 320 inputs the interpolated data from the latch circuit 318 and inverts such data to produce inverted data. Then, the seven bit shifter 322 inputs the invert ed data and shifts such data by seven bits to produce the second shifted data, and the shifted data is output to the data selectors 306 and 314.

The digital ΣΔ demodulation circuit 346 comprises a four bit shifter 324, adders 326, 328, 334, and 33G, latch circuits 330 and 338, a one bit shifter 332, and a data selector 340. Furthermore, the demodulation circuit 346 inputs the interpolated data from the interpolator 344 and outputs one bit of data based on the interpolated data.

In particular, the four bit shifter 324 inputs the interpolated data and shifts such data by four bits to produce fourth shifted data. The adder 326 inputs third selected data from the data selector 340 and the fourth shifted data from the shifter 324 and adds the selected data and shifted data to produce third summed data. Similarly, the adder 328 inputs and adds the second latched data from the latch circuit 330 and the third summed data to produce fourth summed data.

The latch circuit 330 latches the fourth summed data as the second latched data in accordance with the first clock signal CK2 in order to delay the summed data for one period of the clock signal CK2. Afterwards, the one bit shifter 332 inputs the second latched data and shifts such data by one bit to produce fifth shifted data.

The adder 334 inputs the third selected data from the data selector 340 and the fifth shifted data from the shifter 332 and adds the selected data and shifted data to produce fifth summed data. Similarly, the adder 336 inputs and adds third latched data from the latch circuit 338 and the fifth summed data and produces sixth summed data.

The latch circuit 338 latches the sixth summed data as the third latched data based on the first clock signal CK2 in order to delay the sixth summed data for one period of the clock signal CK2. Afterwards, the data selector 340 inputs the most is significant bit MSE of the third latched data, a first preset range value VAL1, and a second preset range value VAL2. Then, the selector 340 selectively outputs the value VAL1 or VAL2 to the adders 326 and 334 based on the value of the most significant bit MSB.

In addition, the preset range values VAL1 and VAL2 are determined in accordance with the desired dynamic range of the digital ΣΔ demodulation circuit 346. Furthermore, such values VAL1 and VAL2 may represent the twos complement of each other as illustrated in equation 4.

$$VAL1 = -1 \times VAL2 \tag{4}$$

Also, the values VAL1 and VAL2 may be selected so as not to produce an overflow condition during 24-bit addition operations.

The D/A analog converter 348 inputs the most significant bit MSB from the ΣΔ demodulation circuit 346 and converts such signal into an analog signal Aout.

As described above, the present invention relates to a D/A converter which converts digital data Din into an analog signal Aout by using an ΣΔ modulation method. Furthermore, the D/A converter has a relatively simple hardware configuration, and thus, it can be easily integrated into a compact structure.

In addition, the present invention is not to limited to the particular structures, devices, and values disclosed in the embodiments above. For example, one of ordinary skill in the art will readily understand that the number of bits which form the various data that are transmitted throughout the device can be changed in accordance with the number of bits of the input digital data, the resolution at which the digital data is to be converted, and/or the particular application of the converter. Consequently, the present invention should only be limited by the scope of the appended claims.

What is claimed is:

1. A digital-to-analog (D/A) converting apparatus for converting digital data to an analog signal, said apparatus comprising:

a sampling rate converting circuit, wherein said sampling rate converting circuit inputs said digital data and converts said digital data into sampled digital data;

an interpolator which interpolates said sampled digital data to produce interpolated data, wherein said interpolator has an infinite impulse response (IIR) filter which performs an IIR filtering operation based on said sampled digital data to produce said interpolated data;

a digital sigma-delta demodulation circuit which inputs said interpolated data, performs a sigma-delta demodulation operation on said interpolated data, and outputs corresponding demodulated data; and an analog digital-to-analog converter for converting said demodulated data to said analog signal, wherein said sampling rate converting circuit converts said digital data into said sampled digital data in accordance with a sampling clock signal, wherein said sampling clock signal has a frequency which is approximately twice a frequency of a transmission clock signal used to transmit said digital data.

2. A digital-to-analog converting apparatus as claimed in claim 1, wherein said sampling rate converting circuit comprises:

a first latch circuit which inputs said digital data and delays said digital data by one period of said sampling clock signal to produce said sampled digital data.

3. A digital-to-analog converting apparatus as claimed in claim 1, wherein said sampling rate converting circuit comprises:

a first latch circuit which inputs said digital data and delays said digital data by one period of said sampling clock signal to produce intermediate sampled digital data; and a second latch circuit which inputs said intermediate sampled digital data and delays said intermediate sampled digital data by one period of said sampling clock signal to produce said sampled digital data.

4. A digital-to-analog (D/A) converting apparatus for converting digital data to an analog signal, said apparatus comprising:

a sampling rate converting circuit, wherein said sampling rate converting circuit inputs said digital data and converts said digital data into sampled digital data;

an interpolator which interpolates said sampled digital data to produce interpolated data, wherein said interpolator has an infinite impulse response (IIR) filter which performs an IIR filtering operation based on said sampled digital data to produce said interpolated data;

a digital sigma-delta demodulation circuit which inputs said interpolated data, performs a sigma-delta demodulation operation on said interpolated data, and outputs corresponding demodulated data; and an analog digital-to-analog converter for converting said demodulated data to said analog signal, wherein said interpolator comprises:

a first shifter for shifting said sampled digital data to produce first shifted data having a bit resolution which is greater than a bit resolution of said sampled digital data, wherein said IIR filter inputs said first shifted data and performs said IIR filtering operation based on said first shifted data.

5. A digital-to-analog converting apparatus as claimed in claim 4, wherein said IIR filter comprises:

a first data selector, wherein said first data selector inputs said first shifted data from said first shifter, second shifted data, and a first clock signal and wherein said first data selector selectively outputs either said first shifted data or said second shifted data as first selected data in accordance with said first clock signal;

a first adder, wherein said first adder inputs said first selected data and first latched data and adds said first selected data and said first latched data to produce first summed data;

a first latch circuit, wherein said first latch circuit inputs said first summed data and delays said first summed data by one period of a second clock signal to produce said first latched data;

a second shifter, wherein said second shifter inputs said first latched data and shifts said first latched data to produce third shifted data;

a second data selector, wherein said second data selector inputs said second shifted data and said third shifted data and wherein said second data selector selectively outputs either said second shifted data or said third shifted data as second selected data in accordance with said first clock signal;

a second adder, wherein said second adder inputs said second selected data and said interpolated data and adds said second selected data and said interpolated data to produce second summed data;

a second latch circuit, wherein said second latch circuit inputs said second summed data and delays said second summed data by one period of said second clock signal to produce said interpolated data;

an inversion circuit, wherein said inversion circuit inputs and inverts said interpolated data to produce inverted data; and a third shifter, wherein said third shifter inputs and shifts said inverted data to produce said second shifted data.

6. A digital-to-analog converting apparatus as claimed in claim 5, wherein said first shifter is an eight bit shifter which shifts said sampled digital data by eight bits to produce said first shifted data, wherein said second shifter is a six bit shifter which shifts said first latched data by six bits to produce said third shifted data, and wherein said third shifter is a seven bit shifter which shifts said inverted data by seven bits to produce said second shifted data.

7. A digital-to-analog converting apparatus as claimed in claim 5, wherein said second clock signal has a frequency which is approximately twice a frequency of said first clock signal.

8. A digital-to-analog converting apparatus as claimed in claim 7, wherein said sampling rate converting circuit converts said digital data into said sampled digital data in accordance with a sampling clock signal, wherein said sampling clock signal has a frequency which is approximately twice a frequency of a transmission clock signal used to transmit said digital data, wherein said frequency of said first clock signal is approximately 128 times said frequency of said sampling clock signal, and wherein said frequency of said second clock signal is approximately 256 times said frequency of said sampling clock signal.

9. A digital-to-analog converting apparatus as claimed in claim 5, wherein said digital sigma-delta demodulation circuit comprises:

a fourth shifter, wherein said fourth shifter inputs and shifts said interpolated data to produce fourth shifted data;

first addition means for inputting said fourth shifted data, third selected data, and second latched data and for adding said fourth shifted data, said third selected data, and said second latched data to produce third summed data;

a third latch circuit, wherein said third latch circuit inputs said third summed data and delays said third summed data by one period of said first clock signal to produce said second latched data;

a fifth shifter, wherein said fifth shifter inputs said second latched data and shifts said second latched data to produce fifth shifted data;

second addition means for inputting said fifth shifted data, said third selected data, and third latched data and for adding said fifth shifted data, said third selected data, and said third latched data to produce fourth summed data;

a fourth latch circuit, wherein said fourth latch circuit inputs said fourth summed data and delays said fourth summed data by one period of said first clock signal to produce said third latched data; and a third data selector, wherein said third data selector inputs a first preset range value, a second preset range value, and at least one bit of said third latched data, wherein said third data selector selectively outputs either said first preset range value or said second preset range value in accordance with said at least one bit of said third latched data, and wherein said at least one bit of said third latched data corresponds to said demodulated data.

10. A digital-to-analog converting apparatus as claimed in claim 9, wherein said first addition means comprises:
   a third adder which inputs said fourth shifted data and said third selected data and adds said fourth shifted data and said third selected data to produce first intermediate summed data; and
   a fourth adder which inputs said first intermediate summed data and said second latched data and adds said first intermediate summed data and said second latched data to produce said third summed data.

11. A digital-to-analog converting apparatus as claimed in claim 10, wherein said second addition means comprises:
   a fifth adder which inputs said fifth shifted data and said third selected data and adds said fifth shifted data and said third selected data to produce second intermediate summed data; and
   a sixth adder which inputs said second intermediate summed data and said third latched data and adds said second intermediate summed data and said third latched data to produce said fourth summed data.

12. A digital-to-analog converting apparatus as claimed in claim 11, wherein said sampling rate converting circuit comprises:
   a fifth latch circuit which inputs said digital data and delays said digital data by one period of a sampling clock signal to produce intermediate sampled digital data; and
   a sixth latch circuit which inputs said intermediate sampled digital data and delays said intermediate sampled digital data by one period of said sampling clock signal to produce said sampled digital data,
   wherein said sampling clock signal has a frequency which is approximately twice a frequency of a transmission clock signal used to transmit said digital data.

13. A digital-to-analog converting apparatus as claimed in claim 9, wherein said first shifter is an eight bit shifter which shifts said sampled digital data by eight bits to produce said first shifted data,
   wherein said second shifter is a six bit shifter which shifts said first latched data by six bits to produce said third shifted data,
   wherein said third shifter is a seven bit shifter which shifts said inverted data by seven bits to produce said second shifted data,
   wherein said fourth shifter is a four bit shifter which shifts said interpolated data by four bits to produce said fourth shifted data, and
   wherein said fifth shifter is a one bit shifter which shifts said second latched data by one bit to produce said fifth shifted data.

14. A digital-to-analog converting apparatus as claimed in claim 9, wherein said second clock signal has a frequency which is approximately twice a frequency of said first clock signal.

15. A digital-to-analog converting apparatus as claimed in claim 14, wherein said sampling rate converting circuit converts said digital data into said sampled digital data in accordance with a sampling clock signal,
   wherein said sampling clock signal has a frequency which is approximately twice a frequency of a transmission clock signal used to transmit said digital data,
   wherein said frequency of said first clock signal is approximately 128 times said frequency of said sampling clock signal, and
   wherein said frequency of said second clock signal is approximately 256 times said frequency of said sampling clock signal.

16. A digital-to-analog converting apparatus as claimed in claim 9, wherein a most significant bit of said third latched data corresponds to said demodulated data.

17. A digital-to-analog converting apparatus as claimed in claim 9, wherein said first preset range value and said second preset range value define a dynamic range of said digital sigma-delta demodulation circuit, and
   wherein said first preset range value and said second preset range value are twos complements of each other.

18. A digital-to-analog (D/A) converting apparatus for converting digital data to an analog signal, said apparatus comprising:
   a sampling rate converting circuit, wherein said sampling rate converting circuit inputs said digital data and converts said digital data into sampled digital data;
   an interpolator which interpolates said sampled digital data to produce interpolated data, wherein said interpolator has an infinite impulse response (IIR) filter which performs an IIR filtering operation based on said sampled digital data to produce said interpolated data;
   a digital sigma-delta demodulation circuit which inputs said interpolated data, performs a sigma-delta demodulation operation on said interpolated data, and outputs corresponding demodulated data; and
   an analog digital-to-analog converter for converting said demodulated data to said analog signal, wherein said digital sigma-delta demodulation circuit comprises:
      a first shifter, wherein said first shifter inputs and shifts said interpolated data to produce first shifted data;
      first addition means for inputting said first shifted data, first selected data, and first latched data and for adding said first shifted data, said first selected data, and said first latched data to produce first summed data;
      a first latch circuit, wherein said first latch circuit inputs said first summed data and delays said first summed data by one period of a first clock signal to produce said first latched data;
      a second shifter, wherein said second shifter inputs said first latched data and shifts said first latched data to produce second shifted data;
      second addition mean for inputting said second shifted data, said first selected data, and second latched data and for adding said second shifted data, said first selected data, and said second latched data to produce second summed data;
      a second latch circuit, wherein said second latch circuit inputs said second summed data and delays said second summed data by one period of said first clock signal to produce said second latched data; and
      a first data selector, wherein said first data selector inputs a first preset range value, a second preset range value, and at least one bit of said second latched data, wherein said first data selector selectively outputs either said first preset range value or said second preset range value in accordance with said at least one bit of said second latched data, and wherein said at least one bit of said second latched data corresponds to said demodulated data.

19. A digital-to-analog converting apparatus as claimed in claim 18, wherein said first addition means comprises:

a first adder which inputs said first shifted data and said first selected data and adds said first shifted data and said first selected data to produce first intermediate summed data; and a second adder which inputs said first intermediate summed data and said first latched data and adds said first intermediate summed data and said first latched data to produce said first summed data.

20. A digital-to-analog converting apparatus as claimed in claim 19, wherein said second addition means comprises:

a third adder which inputs said second shifted data and said first selected data and adds said second shifted data and said first selected data to produce second intermediate summed data; and a fourth adder which inputs said second intermediate summed data and said second latched data and adds said second intermediate summed data and said second latched data to produce said second summed data.

21. A digital-to-analog converting apparatus as claimed in claim 18, wherein a most significant bit of said second latched data corresponds to said demodulated data.

22. A digital-to-analog converting apparatus as claimed in claim 18, wherein said first shifter is a four bit shifter which shifts said interpolated data by four bits to produce said first shifted data, and wherein said second shifter is a one bit shifter which shifts said first latched data by one bit to produce said second shifted data.

23. A digital-to-analog converting apparatus as claimed in claim 18, wherein said first preset range value and said second preset range value define a dynamic range of said digital sigma-delta demodulation circuit, and wherein said first preset range value and said second preset range value are twos complements of each other.

24. A digital-to-analog (D/A) converting apparatus for converting digital data to an analog signal, said apparatus comprising:

an interpolator which interpolates sampled digital data to produce interpolated data, wherein said interpolator has an infinite impulse response (IIR) filter which performs an IIR filtering operation based on said sampled digital data to produce said interpolated data and wherein said sampled data corresponds to said digital data; and a digital sigma-delta demodulation circuit which inputs said interpolated data, performs a sigma-delta demodulation operation on said interpolated data, and outputs corresponding demodulated data, wherein said demodulated data corresponds to said analog signal, wherein said interpolator comprises:

a first shifter for shifting said sampled digital data to produce first shifted data having a bit resolution which is greater than a bit resolution of said sampled digital data, wherein said IIR filter inputs said first shifted data and performs said IIR filtering operation based on said first shifted data.

25. A digital-to-analog converting apparatus as claimed in claim 24, wherein said IIR filter comprises:

a first data selector, wherein said first data selector inputs said first shifted data from said first shifter, second shifted data, and a first clock signal and wherein said first data selector selectively outputs either said first shifted data or said second shifted data as first selected data in accordance with said first clock signal;

a first adder, wherein said first adder inputs said first selected data and first latched data and adds said first selected data and said first latched data to produce first summed data;

a first latch circuit, wherein said first latch circuit inputs said first summed data and delays said first summed data by one period of a second clock signal to produce said first latched data;

a second shifter, wherein said second shifter inputs said first latched data and shifts said first latched data to produce third shifted data;

a second data selector, wherein said second data selector inputs said second shifted data and said third shifted data and wherein said second data selector selectively outputs either said second shifted data or said third shifted data as second selected data in accordance with said first clock signal;

a second adder, wherein said second adder inputs said second selected data and said interpolated data and adds said second selected data and said interpolated data to produce second summed data;

a second latch circuit, wherein said second latch circuit inputs said second summed data and delays said second summed data by one period of said second clock signal to produce said interpolated data;

an inversion circuit, wherein said inversion circuit inputs and inverts said interpolated data to produce inverted data; and a third shifter, wherein said third shifter inputs and shifts said inverted data to produce said second shifted data.

26. A digital-to-analog converting apparatus as claimed in claim 25, wherein said digital sigma-delta demodulation circuit comprises:

a fourth shifter, wherein said fourth shifter inputs and shifts said interpolated data to produce fourth shifted data;

first addition means for inputting said fourth shifted data, third selected data, and second latched data and for adding said fourth shifted data, said third selected data, and said second latched data to produce third summed data;

a third latch circuit, wherein said third latch circuit inputs said third summed data and delays said third summed data by one period of said first clock signal to produce said second latched data;

a fifth shifter, wherein said fifth shifter inputs said second latched data and shifts said second latched data to produce fifth shifted data;

second addition means for inputting said fifth shifted data, said third selected data, and third latched data and for adding said fifth shifted data, said third selected data, and said third latched data to produce fourth summed data;

a fourth latch circuit, wherein said fourth latch circuit inputs said fourth summed data and delays said fourth summed data by one period of said first clock signal to produce said third latched data; and a third data selector, wherein said third data selector inputs a first preset range value, a second preset range value, and at least one bit of said third latched data, wherein said third data selector selectively outputs either said first preset range value or said second preset range value in accordance with said at least one bit of said third latched data, and wherein said at least one bit of said third latched data corresponds to said demodulated data.

27. A digital-to-analog converting apparatus for converting digital data to an analog signal, said apparatus comprising:

an interpolator which interpolates sampled digital data to produce interpolated data, wherein said interpolator has an infinite impulse response (IIR) filter which performs an IIR filtering operation based on said sampled digital data to produce said interpolated data and wherein said sampled data corresponds to said digital data; and a digital sigma-delta demodulation circuit which inputs said interpolated data, performs a sigma-delta demodulation operation on said interpolated data, and outputs corresponding demodulated data, wherein said demodulated data corresponds to said analog signal, wherein said digital sigma-delta demodulation circuit comprises:

a first shifter, wherein said first shifter inputs and shifts said interpolated data to produce first shifted data;

first addition means for inputting said first shifted data, first selected data, and first latched data and for adding said first shifted data, said first selected data, and said first latched data to produce first summed data;

a first latch circuit, wherein said first latch circuit inputs said first summed data and delays said first summed data by one period of a first clock signal to produce said first latched data;

a second shifter, wherein said second shifter inputs said first latched data and shifts said first latched data to produce second shifted data;

second addition means for inputting said second shifted data, said first selected data, and second latched data and for adding said second shifted data, said first selected data, and said second latched data to produce second summed data;

a second latch circuit, wherein said second latch circuit inputs said second summed data and delays said second summed data by one period of said first clock signal to produce said second latched data; and a first data selector, wherein said first data selector inputs a first preset range value, a second preset range value, and at least one bit of said second latched data, wherein said first data selector selectively outputs either said first preset range value or said second preset range value in accordance with said at least one bit of said second latched data, and wherein said at least one bit of said second latched data corresponds to said demodulated data.

28. A digital-to-analog (D/A) converting apparatus for converting digital data to an analog signal, said apparatus comprising:

an interpolator which interpolates sampled digital data to produce interpolated data, wherein said interpolator has an infinite impulse response (IIR) filter which performs an IIR filtering operation based on said sampled digital data to produce said interpolated data and wherein said sampled data corresponds to said digital data; and a digital sigma-delta demodulation circuit which inputs said interpolated data, performs a sigma-delta demodulation operation on said interpolated data, and outputs corresponding demodulated data, wherein said demodulated data corresponds to said analog signal, wherein said interpolator comprises a first circuit which inputs said sampled digital data and outputs first data based on said sampled digital data, and wherein said IIR filter inputs said first data and performs said IIR filtering operation based on said first data.

29. A digital-to-analog converting apparatus as claimed in claim 28, wherein said IIR filter comprises:

a second circuit which inputs said interpolated data and outputs second data based on said interpolated data; and an interpolation circuit which inputs said first data and said second data and outputs said interpolated data based on said first data and said second data.

30. A digital-to-analog converting apparatus as claimed in claim 29, wherein said interpolation circuit comprises:

a third circuit which inputs said first data and said second data and outputs third data based on said first data and said second data; and a fourth circuit which inputs said second data and third data and outputs said interpolated data based on said second data and said third data.

31. A digital-to-analog converting apparatus as claimed in claim 30, wherein said first circuit comprises a first shifter for shifting said sampled digital data to produce said first data, and wherein said first data has a bit resolution which is greater than a bit resolution of said sampled digital data.

32. A digital-to-analog converting apparatus as claimed in claim 30, wherein said second circuit comprises:

an inversion circuit which inputs and inverts said interpolated data to produce inverted data; and a first shifter which inputs and shifts said inverted data to produce said second data.

33. A digital-to-analog converting apparatus as claimed in claim 30, wherein said third circuit comprises:

a first data selector which inputs said first data from said first circuit, said second data from said second circuit, and a first clock signal, wherein said first data selector selectively outputs either said first data or said second data as first selected data in accordance with said first clock signal;

a first adder which inputs said first selected data and first latched data and adds said first selected data and said first latched data to produce first summed data;

a first latch circuit which inputs said first summed data and delays said first summed data by one period of a second clock signal to produce said first latched data; and a first shifter which inputs said first latched data and shifts said first latched data to produce said third data.

34. A digital-to-analog converting apparatus as claimed in claim 30, wherein said fourth circuit comprises:

a first data selector which inputs said second data and said third data, wherein said first data selector selectively outputs either said second data or said third data as first selected data in accordance with a first clock signal;

a first adder which inputs said first selected data and said interpolated data and adds said first selected data and said interpolated data to produce first summed data; and a first latch circuit which inputs said first summed data and delays said first summed data by one period of a second clock signal to produce said interpolated data.

35. A digital-to-analog (D/A) converting apparatus for converting digital data to an analog signal, said apparatus comprising:

an interpolator which interpolates sampled digital data to produce interpolated data, wherein said interpolator has an infinite impulse response (IIR) filter which performs an IIR filtering operation based on said sampled digital data to produce said interpolated data and wherein said sampled data corresponds to said digital data; and a digital sigma-delta demodulation circuit which inputs said interpolated data, performs a sigma-delta demodulation operation on said interpolated data, and outputs corresponding demodulated data, wherein said demodulated data corresponds to said analog signal, wherein said digital sigma-delta demodulation circuit comprises:

a first circuit which inputs said interpolated data and outputs first data based on said interpolated data;

a second circuit which inputs preset range values and at least one bit of first latched data and outputs second data based on said preset range values and said at least one bit of said first latched data; and a latching circuit which inputs said first data and said second data and outputs said first latched data based on said first data and said second data.

36. A digital-to-analog converting apparatus as claimed in claim 35, wherein said latching circuit comprises:

a third circuit which inputs said first data and said second data and outputs third data based on said first data and said second data; and a fourth circuit which inputs said second data and said third data and outputs said first latched data based on said second data and said third data.

37. A digital-to-analog converting apparatus as claimed in claim 36, wherein said first circuit comprises a first shifter which inputs and shifts said interpolated data to produce said first data.

38. A digital-to-analog converting apparatus as claimed in claim 36, wherein said second circuit comprises a first data selector which inputs a first preset range value, a second preset range value, and said at least one bit of said first latched data, wherein said first data selector selectively outputs either said first preset range value or said second preset range value in accordance with said at least one bit of said first latched data, and wherein said at least one bit of said first latched data corresponds to said demodulated data.

39. A digital-to-analog converting apparatus as claimed in claim 36, wherein said third circuit comprises:

a first addition circuit which inputs said first data, said second data, and second latched data and which adds said first data, said second data, and said second latched data to produce first summed data;

a first latch circuit which inputs said first summed data and delays said first summed data by one period of a first clock signal to produce said second latched data; and a first shifter which inputs said second latched data and shifts said second latched data to produce said third data.

40. A digital-to-analog converting apparatus as claimed in claim 36, wherein said fourth circuit comprises:

a first addition circuit which inputs said third data, said second data, and said first latched data and which adds said third data, said second data, and said first latched data to produce first summed data; and a first latch circuit which inputs said first summed data and delays said first summed data by one period of a first clock signal to produce said first latched data.

* * * * *